(12) United States Patent
Kim et al.

(10) Patent No.: US 12,101,930 B2
(45) Date of Patent: Sep. 24, 2024

(54) MEMORY DEVICE HAVING VERTICAL STRUCTURE

(71) Applicant: SK hynix Inc., Icheon-si (KR)

(72) Inventors: Jin Ho Kim, Icheon-si (KR); Kwang Hwi Park, Icheon-si (KR); Sang Hyun Sung, Icheon-si (KR); Sung Lae Oh, Icheon-si (KR); Chang Woon Choi, Icheon-si (KR)

(73) Assignee: SK hynix inc., Icheon-si (KR)

( * ) Notice: Subject to any disclaimer, the term of this patent is extended or adjusted under 35 U.S.C. 154(b) by 178 days.

(21) Appl. No.: 17/828,417

(22) Filed: May 31, 2022

(65) Prior Publication Data

US 2022/0293619 A1    Sep. 15, 2022

Related U.S. Application Data

(63) Continuation of application No. 17/145,209, filed on Jan. 8, 2021, now Pat. No. 11,380,702.

(30) Foreign Application Priority Data

Jul. 6, 2020  (KR) .......................... 10-2020-0082736

(51) Int. Cl.
H10B 41/27    (2023.01)
H10B 41/40    (2023.01)
H10B 43/27    (2023.01)
H10B 43/40    (2023.01)

(52) U.S. Cl.
CPC ............. *H10B 41/27* (2023.02); *H10B 41/40* (2023.02); *H10B 43/27* (2023.02); *H10B 43/40* (2023.02)

(58) Field of Classification Search
CPC .......... G11C 8/12; H10B 41/27; H10B 43/40; H10B 43/27
See application file for complete search history.

(56) References Cited

U.S. PATENT DOCUMENTS

| | | | |
|---|---|---|---|
| 8,947,931 B1 * | 2/2015 | D'Abreu | H01L 25/0652 365/185.11 |
| 11,842,986 B1 * | 12/2023 | Ramin | H01L 24/16 |
| 2017/0170156 A1 * | 6/2017 | Hong | H01L 25/0652 |
| 2019/0043836 A1 | 2/2019 | Fastow et al. | |
| 2021/0389879 A1 * | 12/2021 | Inbar | G06F 3/0656 |

* cited by examiner

*Primary Examiner* — Han Yang

(57) ABSTRACT

A memory device includes a cell wafer including a memory cell array; and a peripheral wafer including a row control circuit, a column control circuit and a peripheral circuit which control the memory cell array, and stacked on and bonded to the cell wafer in a first direction. The peripheral wafer includes a first substrate having a first surface and a second surface which face away from each other in the first direction; a first logic structure disposed on the first surface of the first substrate, and including the row control circuit and the column control circuit; and a second logic structure disposed on the second surface of the first substrate, and including the peripheral circuit.

5 Claims, 14 Drawing Sheets

MEMORY DEVICE HAVING VERTICAL STRUCTURE

CROSS-REFERENCE TO RELATED APPLICATION

The present application is a continuation application of a U.S. patent application Ser. No. 17/145,209, filed on Jan. 8, 2021, which claims priority under 35 U.S.C. § 119(a) to Korean Patent Application No. 10-2020-0082736 filed in the Korean Intellectual Property Office on Jul. 6, 2020, which is incorporated herein by reference in its entirety.

BACKGROUND

1. Technical Field

Various embodiments generally relate to a semiconductor technology, and particularly, to a memory device having a vertical structure.

2. Related Art

A memory device may include a memory cell array composed of memory cells that have different states depending on data stored therein. The memory cells may be accessed through word lines and bit lines, and the memory device may include circuits that are configured to access the memory cells by controlling the word lines and the bit lines. In addition, the memory device may include a circuit that is configured to perform an operation requested from the outside, such as data write, read and erase operations.

SUMMARY

Various embodiments are directed to measures capable of contributing to improving the degree of integration of a memory device.

In an embodiment, a vertical type memory device may include: a cell wafer including a memory cell array; and a peripheral wafer, including a row control circuit, a column control circuit and a peripheral circuit, stacked on and bonded to the cell wafer in a first direction. The peripheral wafer may include: a first substrate having a first surface and a second surface that face away from each other in the first direction; a first logic structure, disposed on the first surface of the first substrate, that includes the row control circuit and the column control circuit; and a second logic structure, disposed on the second surface of the first substrate, that includes the peripheral circuit. The row control circuit, the column control circuit and the peripheral circuit control the memory cell array.

In an embodiment, a vertical type memory device may include: a logic circuit part including a row control circuit, a column control circuit and a peripheral circuit; and a cell part stacked on the logic circuit part in a first direction, and including the memory cell array. The logic circuit part may include: a substrate having a first surface and a second surface that face away from each other in the first direction; a first logic circuit part, disposed on the first surface of the substrate, and including the row control circuit and the column control circuit; and a second logic circuit part, disposed on the second surface of the substrate, and including the peripheral circuit. The row control circuit, the column control circuit and the peripheral circuit control the memory cell array.

In an embodiment, a vertical type memory device may include: a cell wafer including a memory cell array; a first peripheral wafer including a row control circuit and a column control circuit; and a second peripheral wafer including a peripheral circuit. The first peripheral wafer and the second peripheral wafer may be stacked on the cell wafer in a first direction. The row control circuit, the column control circuit and the peripheral circuit control the memory cell array.

DETAILED DESCRIPTION

Figure 1:
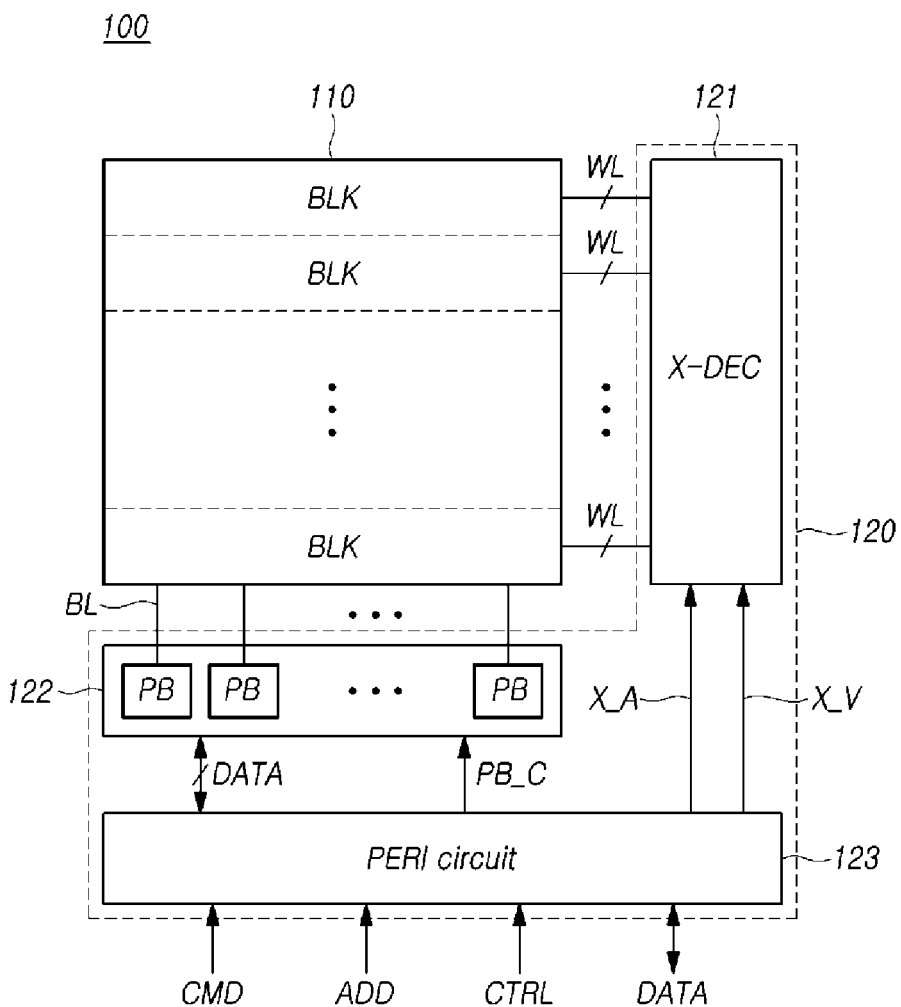
FIG. 1 is a block diagram schematically illustrating a representation of a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there is may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram schematically illustrating a representation of a memory device in accordance with an embodiment of the disclosure.

Referring to FIG. 1, a memory device 100 in accordance with an embodiment of the disclosure may include a memory cell array 110 and a logic circuit 120. The logic circuit 120 may include a row decoder (X-DEC) 121, a page buffer circuit 122 and a peripheral circuit (PERI circuit) 123.

The memory cell array 110 may include a plurality of memory blocks BLK. Each of the plurality of memory blocks BLK may include a plurality of memory cells. The memory blocks BLK may be coupled to the row decoder 121 through a plurality of word lines WL. The memory cell array 110 may be coupled to the page buffer circuit 122 through a plurality of bit lines BL.

The row decoder (X-DEC) 121 may select any one among the memory blocks BLK included in the memory cell array 110, in response to a row address X_A provided from the peripheral circuit (PERI circuit) 123. The row decoder (X-DEC) 121 may transfer an operating voltage X_V, provided from the peripheral circuit (PERI circuit) 123, to word lines WL coupled to a memory block BLK that is selected from among the memory blocks BLK included in the memory cell array 110.

Although not illustrated, the row decoder (X-DEC) 121 may include a pass transistor circuit and a block switch circuit. The pass transistor circuit may include a plurality of pass transistor groups. The plurality of pass transistor groups may be coupled to the plurality of memory blocks BLK, respectively. Each pass transistor group may be coupled to a corresponding memory block BLK through a plurality of word lines WL. The block switch circuit may select one of the pass transistor groups included in the pass transistor circuit, in response to the row address X_A received from the peripheral circuit (PERI circuit) 123. The block switch circuit may include a plurality of block switches, which are coupled to the pass transistor groups, respectively. As the row address X_A is received from the peripheral circuit (PERI circuit) 123, any one of the block switches may be activated in response to the received row address X_A. The activated block switch may transfer a signal, provided from the peripheral circuit (PERI circuit) 123, to a corresponding pass transistor group. The pass transistor group selected by the block switch circuit, that is, provided with the signal from the block switch circuit, may transfer the operating voltage X_V to word lines WL, which are coupled to a corresponding memory block BLK.

The page buffer circuit 122 may include a plurality of page buffers PB, which are coupled to the bit lines BL, respectively. The page buffers PB may receive a page buffer control signal PB_C from the peripheral circuit (PERI circuit) 123, and may transmit and receive a data signal DATA to and from the peripheral circuit (PERI circuit) 123. The page buffers PB may control the bit lines BL in response to the page buffer control signals PB_C. For example, the page buffers PB may detect data, stored in the memory cells of the memory cell array 110, by sensing the signals of the bit lines BL in response to the page buffer control signal PB_C, and may transmit the data signal DATA to the peripheral circuit (PERI circuit) 123 depending on the detected data. The page buffers PB may apply a signal to the bit lines BL, based on the data signal DATA received from the peripheral circuit (PERI circuit) 123, in response to the page buffer control signal PB_C, and thereby, may write data in the memory cells of the memory cell array 110. The page buffers PB may write data in or read data from memory cells which are coupled to an activated word line WL.

The peripheral circuit (PERI circuit) 123 may receive a command signal CMD, an address signal ADD and a control signal CTRL from a device outside the memory device 100, for example, a memory controller, and may transmit and receive data DATA to and from the device outside the memory device 100. The peripheral circuit (PERI circuit) 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit (PERI circuit) 123 may generate various voltages including the operating voltage X_V, which are required in the memory device 100.

As the degree of integration of the memory device 100 increases and the operating speed thereof increases, it is necessary to reduce a delay time caused in a process in which an operating voltage from the row decoder (X-DEC) 121 is transferred to the word lines WL. To this end, the row decoder (X-DEC) 121 may be disposed to have a shape extending in a direction in which the word lines WL are arranged, and may have a length substantially the same as or similar to the memory cell array 110 in the direction in which the word lines WL are arranged.

As the degree of integration of the memory device 100 increases and the operating speed thereof increases, it is necessary to reduce a delay time of a signal applied to the bit lines BL by the page buffer circuit 122 or a signal provided to the page buffer circuit 122 through the bit lines BL. To this end, the page buffer circuit 122 may be disposed to have a shape extending in a direction in which the bit lines BL are arranged, and may have a length substantially the same as or similar to the memory cell array 110 in the direction in which the bit lines BL are arranged.

As the size of an electronic product in which the memory device 100 is mounted decreases, reducing the size of the memory device 100 is continuously demanded. As the number of the word lines WL increases due to a demand for high capacity, the number of pass transistors of the row decoder 121 is increasing. In consideration, pass transistors are disposed in a plurality of columns in an extending direction of the word lines WL. For the above reasons, the occupation area of the row decoder 121 is increasing.

As the pitch of the bit lines BL decreases due to an increase in the degree of integration, the page buffers PB configuring the page buffer circuit 122 are disposed in a plurality of rows in an extending direction of the bit lines BL. Accordingly, the occupation area of the page buffer circuit 122 increases.

As such, as the size of the memory device 100 decreases and the occupation areas of the row decoder 121 and the page buffer circuit 122 increase, a space for disposing the peripheral circuit 123 may be insufficient. Embodiments of the disclosure may suggest measures capable of solving a problem due to an insufficient space for disposing the peripheral circuit 123 attributable to the size reduction, high capacity and high degree of integration of the memory device 100.

Hereinbelow, in the accompanying drawings, a direction vertically projecting from the top surface of a substrate is defined as a first direction FD, and two directions parallel to the top surface of the substrate and intersecting with each other are defined as a second direction SD and a third direction TD, respectively. For example, the second direction SD may correspond to the extending direction of word lines, and the third direction TD may correspond to the extending direction of bit lines. The second direction SD and the third direction TD may intersect substantially perpendicularly with each other. The first direction FD may be orthogonal to the second direction SD and the third direction TD. In the drawings, a direction indicated by an arrow and a direction opposite thereto represent the same direction.

Although, the present specification describes the memory device 100 as a flash memory device as an example, the type of memory is not limited thereto, and the technical spirit of the disclosure may be applied to other types of memories in addition to flash memory. For example, a memory may be a DRAM, a PCRAM or a ReRAM. Although the present specification illustrates a case in which a row control circuit coupled to the word lines WL of the memory cell array 110 is a row decoder and a column control circuit coupled to the bit lines BL of the memory cell array 110 is a page buffer circuit, this represents a circuit configuration where a memory is a flash memory, and it should be understood that the row control circuit and the column control circuit may be changed depending on the type of a memory.

Figure 2:
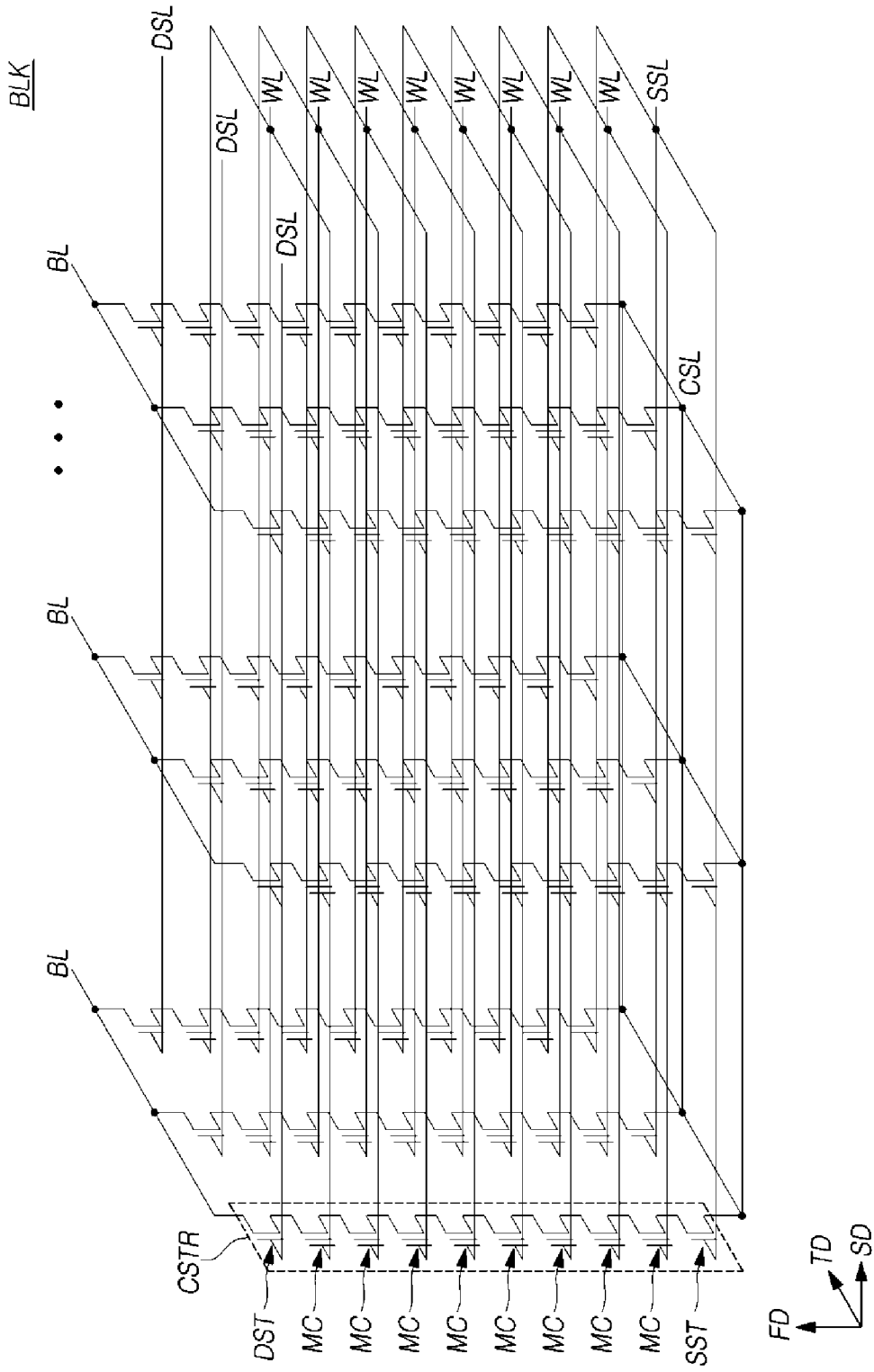
FIG. 2 is an equivalent circuit diagram illustrating a representation of an example of a memory block illustrated in FIG. 1.

FIG. 2 is an equivalent circuit diagram illustrating a representation of a memory block BLK illustrated in FIG. 1.

Referring to FIG. 2, the memory block BLK may include a plurality of cell strings CSTR, which are coupled between a plurality of bit lines BL and a common source line CSL. The bit lines BL may extend in the third direction TD and be arranged in the second direction SD. A plurality of cell strings CSTR may be coupled in parallel to each of the bit lines BL. The cell strings CSTR may be coupled in common to the common source line CSL. The plurality of cell strings CSTR may be coupled between the plurality of bit lines BL and the one common source line CSL.

Each of the cell strings CSTR may include a drain select transistor DST, which is coupled to the bit line BL, a source select transistor SST, which is coupled to the common source line CSL, and a plurality of memory cells MC, which are coupled between the drain select transistor DST and the source select transistor SST. The drain select transistor DST, the memory cells MC and the source select transistor SST may be coupled in series in the first direction FD.

Drain select lines DSL, a plurality of word lines WL and a source select line SSL may be stacked between the bit lines BL and the common source line CSL in the first direction FD. Each of the drain select lines DSL may be coupled to the gates of corresponding drain select transistors DST. Each of the word lines WL may be coupled to the gates of corresponding memory cells MC. The source select line SSL may be coupled to the gates of source select transistors SST. Memory cells MC that are coupled in common to one word line WL may configure one page.

Figure 3:
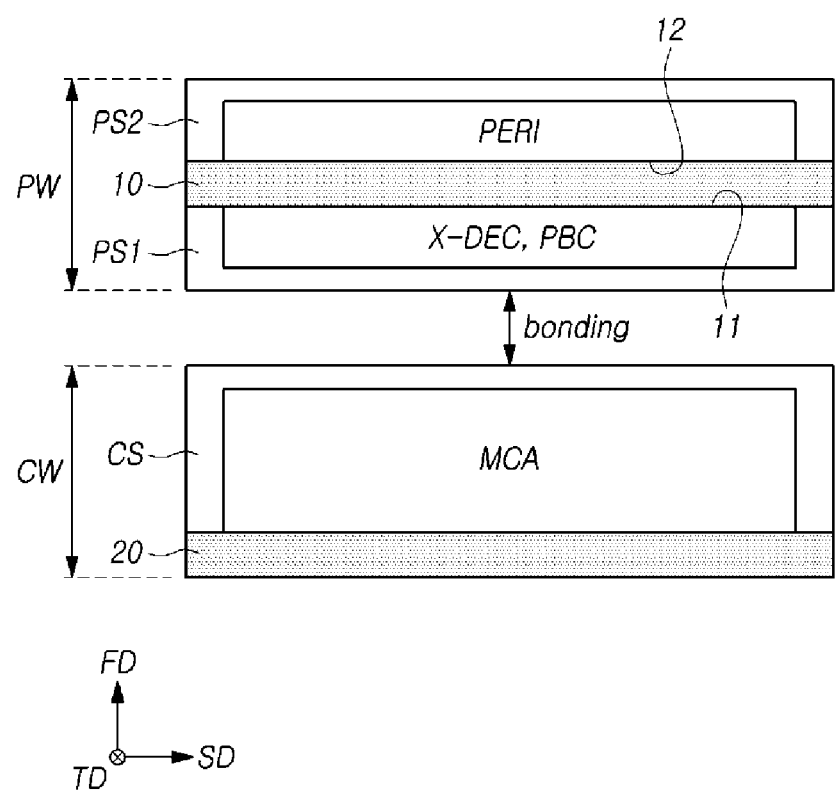
FIG. 3 is a cross-sectional view illustrating a representation of a schematic structure of a memory device in accordance with an embodiment of the disclosure.

FIG. 3 is a cross-sectional view illustrating a representation of a schematic structure of a memory device in accordance with an embodiment of the disclosure.

Referring to FIG. 3, a memory device in accordance with an embodiment of the disclosure may include a cell wafer CW, and a peripheral wafer PW, which is stacked on and bonded to the cell wafer CW in the first direction FD. In order to facilitate understanding, FIG. 3 illustrates that the cell wafer CW and the peripheral wafer PW are separated from each other, but it should be understood that the top surface of the cell wafer CW and the bottom surface of the peripheral wafer PW are in contact with each other.

The peripheral wafer PW may include a substrate 10, a first logic structure PS1, and a second logic structure PS2. The substrate 10 may have a first surface 11 and a second surface 12 that face away from each other in the first direction FD. The first surface 11 may be a surface closer to the cell wafer CW than the second surface 12. The first logic structure PS1 may be disposed on the first surface 11 of the substrate 10, and the second logic structure PS2 may be disposed on the second surface 12 of the substrate 10. The first logic structure PS1 may be bonded to the cell wafer CW.

The first logic structure PS1 may include a row decoder X-DEC and a page buffer circuit PBC. The row decoder X-DEC may correspond to the row decoder 121 illustrated in FIG. 1, and the page buffer circuit PBC may correspond to the page buffer circuit 122 illustrated in FIG. 1. The second logic structure PS2 may include a peripheral circuit PERI. The peripheral circuit PERI may correspond to the peripheral circuit 123 illustrated in FIG. 1.

The row decoder X-DEC and the page buffer circuit PBC directly interface with a memory cell array MCA and are configured in the first logic structure PS1, which is bonded to the cell wafer CW. As a result, the lengths of electrical paths that couple the row decoder X-DEC and the page buffer circuit PBC to the memory cell array MCA may be shortened.

The cell wafer CW may include a substrate 20, and a cell structure CS that is defined on the substrate 20. The cell structure CS may include the memory cell array MCA. Although not illustrated, the memory cell array MCA may include a plurality of word lines that extend in the second direction SD, a plurality of bit lines that extend in the third direction TD, and a plurality of memory cells, which are coupled to the plurality of word lines and the plurality of bit lines.

FIGS. 4A to 4D are top views illustrating representations of layouts of a row decoder and a page buffer circuit of a memory device in accordance with embodiments of the disclosure.

Figure 4A:
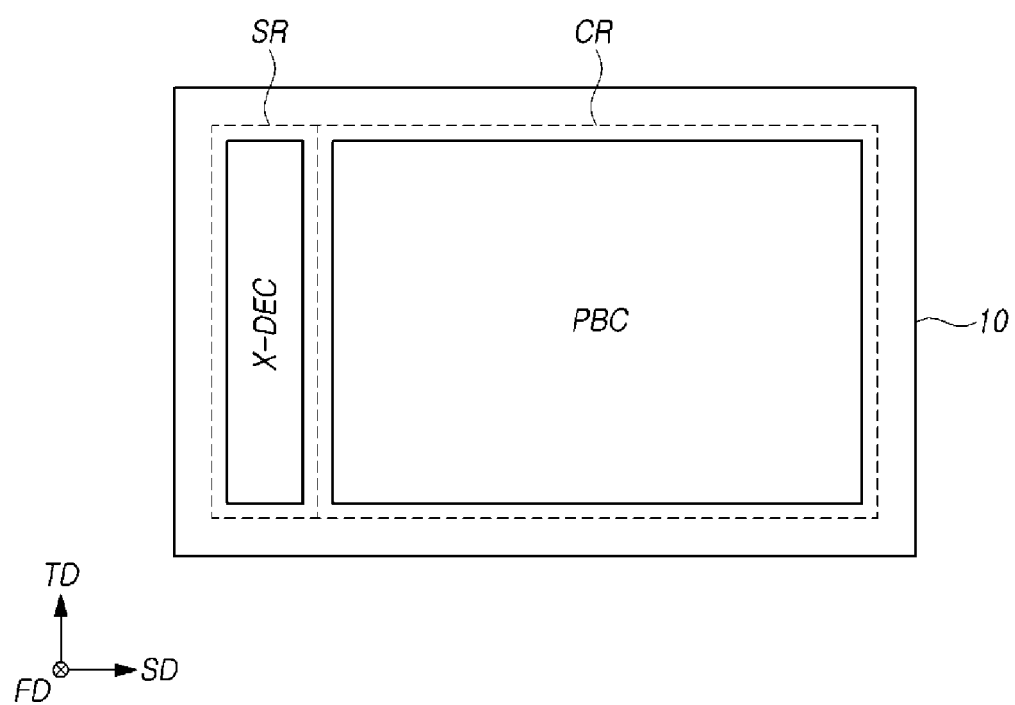
FIGS. 4A to 4D are top views illustrating representations layouts of a page buffer circuit and a row decoder of a memory device in accordance with embodiments of the disclosure.

Referring to FIG. 4A, a substrate 10 of a peripheral wafer may include a cell region CR and a slimming region SR. The cell region CR may be a region that overlaps with a memory cell array (MCA of FIG. 3) in the first direction FD. The slimming region SR may be adjacent to the cell region CR in the second direction SD. The slimming region SR is a region in which a wiring structure, which couples word lines of the memory cell array and a row decoder X-DEC, is disposed.

The row decoder X-DEC may be disposed in the slimming region SR. As described above, in order to reduce a delay time induced in a process in which an operating voltage from the row decoder X-DEC is transferred to word lines (WL), the row decoder X-DEC may be disposed to have a shape extending in the third direction TD as a direction in which the word lines (WL) are arranged.

A page buffer circuit PBC may be disposed in the cell region CR. As described above, in order to reduce a delay time of a signal that is applied to bit lines (BL) by the page buffer circuit PBC or a signal that is provided to the page buffer circuit PBC through the bit lines (BL), the page buffer circuit PBC may have a length substantially the same as or similar to that of the cell region CR in the second direction SD as a direction in which the bit lines (BL) are arranged. As the pitch of the bit lines (BL) decreases due to an increase in the degree of integration, page buffers configuring the page buffer circuit PBC are disposed in a plurality of rows in the third direction TD as a direction in which the bit lines (BL) extend. According to this fact, the page buffer circuit PBC may be disposed to have a width substantially the same as or similar to that of the cell region CR in the third direction TD.

Figure 4B:
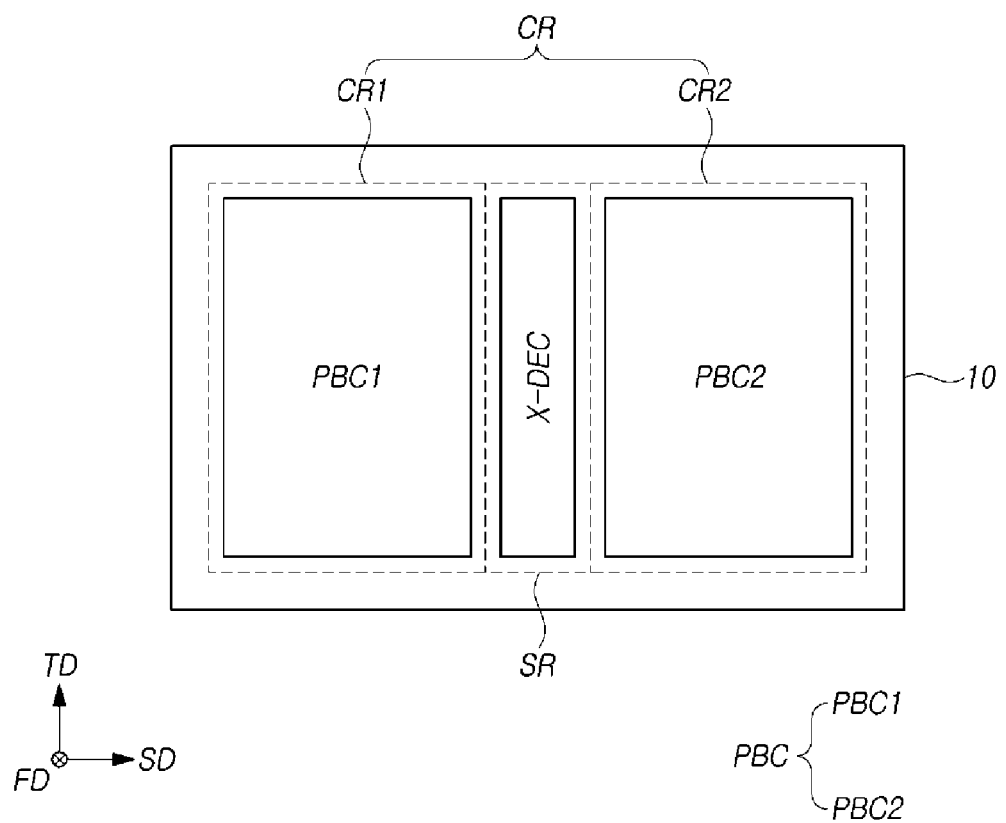

Referring to FIG. 4B, a slimming region SR may be disposed at the center portion of a substrate 10. A cell region CR may be divided into a first cell region CR1 and a second cell region CR2, and may be disposed on both sides of the slimming region SR in the second direction SD.

A row decoder X-DEC may be disposed in the slimming region SR. A page buffer circuit PBC may be divided into a first page buffer circuit PBC1 and a second page buffer circuit PBC2, and may be disposed in the first cell region CR1 and the second cell region CR2, respectively.

Figure 4C:
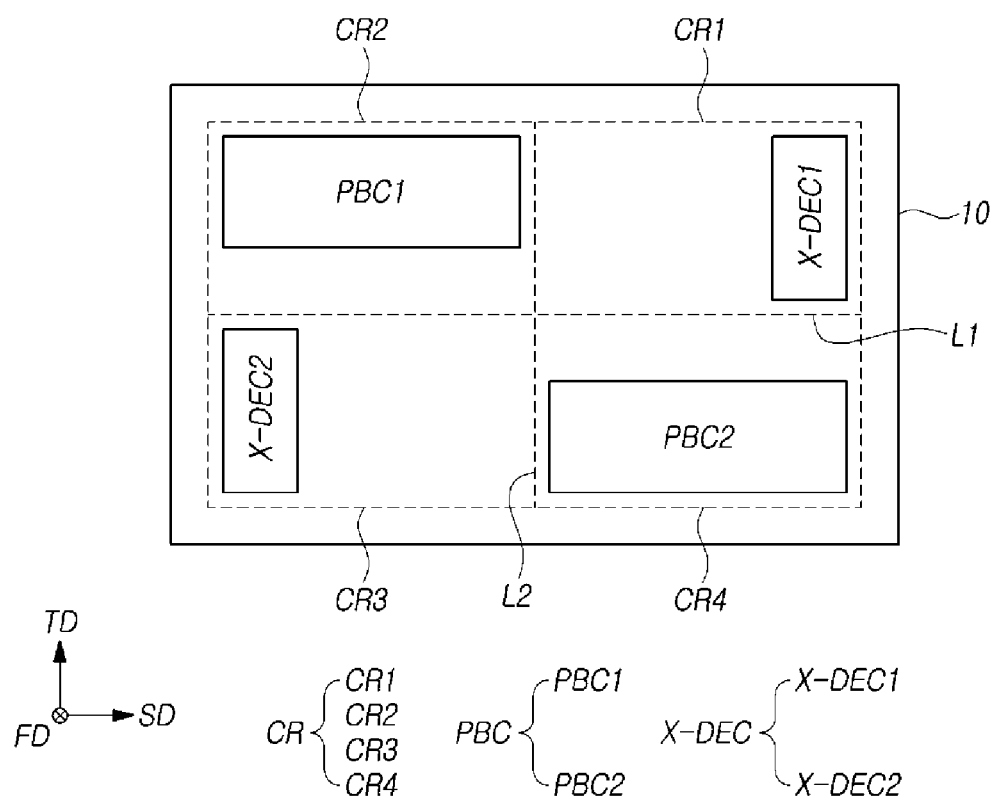
Figure 4D:
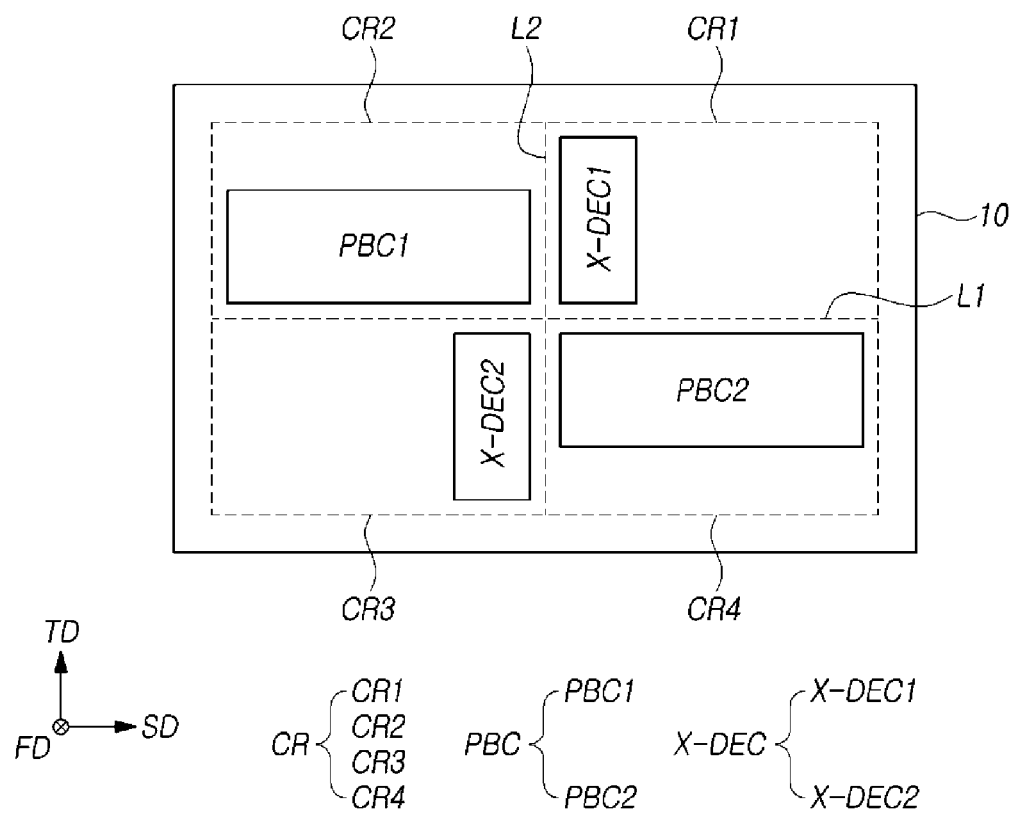

Referring to FIGS. 4C and 4D, in order to increase an area overlapping with a memory cell array in the first direction TD, each of a row decoder X-DEC and a page buffer circuit PBC may be divided into at least two parts and disposed in different regions.

For example, a cell region CR may include first to fourth cell regions CR1 to CR4, which are divided by a first line L1 and a second line L2 intersecting with each other at a single intersection point. The row decoder X-DEC may be divided into a first row decoder X-DEC1 and a second row decoder X-DEC2, and may be disposed in the first cell region CR1 and the third cell region CR3, respectively. The page buffer circuit PBC may be divided into a first page buffer circuit PBC1 and a second page buffer circuit PBC2, and may be disposed in the second cell region CR2 and the fourth cell region CR4, respectively.

As illustrated in FIG. 4C, the first and second row decoders X-DEC1 and X-DEC2 and the first and second page buffer circuits PBC1 and PBC2 may be disposed, in the different cell regions, to be adjacent to the corners of the cell regions CR. Meanwhile, as illustrated in FIG. 4D, the first and second row decoders X-DEC1 and X-DEC2 and the first and second page buffer circuits PBC1 and PBC2 may be disposed, in the different cell regions, to be adjacent to the intersection point between the first line L1 and the second line L2.

Figure 5:
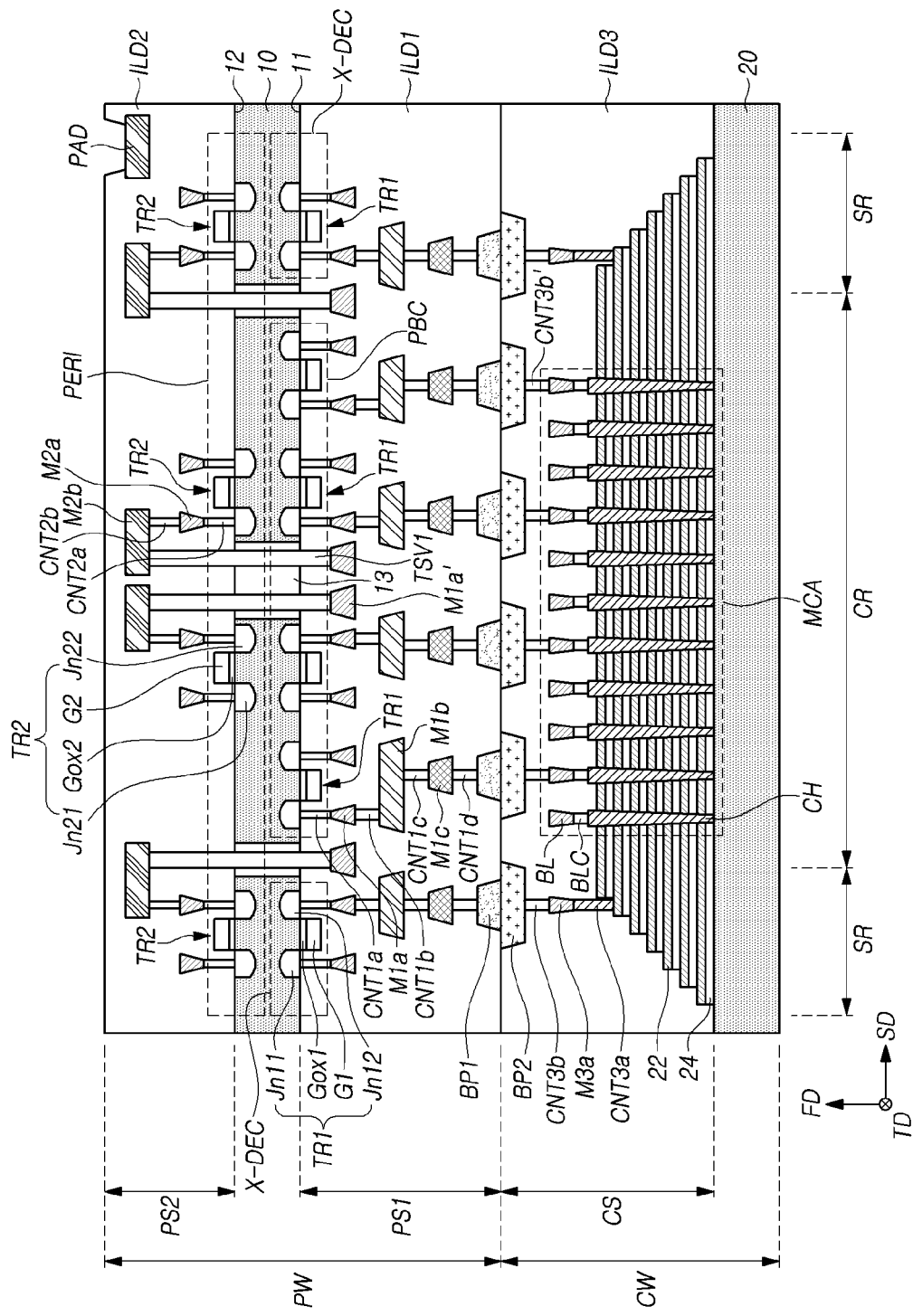
FIG. 5 is a detailed view of FIG. 3.

FIG. 5 is a detailed view of FIG. 3.

Referring to FIG. 5, the substrate 10 of the peripheral wafer PW may be a single crystal semiconductor film. For example, the substrate 10 may be a bulk silicon substrate, a germanium substrate, a silicon-germanium substrate, or an epitaxial thin film formed through selective epitaxial growth.

The first logic structure PS1 may include the row decoder X-DEC and the page buffer circuit PBC. The row decoder X-DEC may be disposed in a slimming region SR common to the first surface 11 of the substrate 10, and the page buffer circuit PBC may be disposed in a cell region CR common to the first surface 11 of the substrate 10.

Each of the row decoder X-DEC and the page buffer circuit PBC may include a plurality of first horizontal transistors TR1. The first horizontal transistor TR1 may include a gate dielectric layer Gox1 that is disposed on the first surface 11 of the substrate 10, a gate electrode G1 that is disposed on the gate dielectric layer Gox1, and junctions Jn11 and Jn12 that are defined in an active region of the substrate 10 on both sides of the gate electrode G1. The junctions Jn11 and Jn12 are regions that are defined by implanting an n-type or p-type impurity into the active region of the first surface 11 of the substrate 10. One of the junctions Jn11 and Jn12 may be used as a source region of the first horizontal transistor TR1, and the other junction may be used as a drain region of the first horizontal transistor TR1.

A dielectric layer ILD1 may be defined on the first surface 11 of the substrate 10 to cover the row decoder X-DEC and the page buffer circuit PBC. The bottom surface of the dielectric layer ILD1 may configure one surface of the peripheral wafer PW, which is bonded to the cell wafer CW.

Contacts CNT1a to CNT1d and wiring lines M1a to M1c and M1a' may be defined in the dielectric layer ILD1. The contacts CNT1a to CNT1d and the wiring lines M1a to M1c and M1a' may be coupled to the row decoder X-DEC or the page buffer circuit PBC. Although not shown in detail in FIG. 5, each of the wiring lines M1a' may be coupled to the corresponding wiring line M1a, and may be coupled to the row decoder X-DEC or the page buffer circuit PBC through the corresponding wiring line M1a and the contact CNT1a. The peripheral wafer PW may include a plurality of bonding pads BP1 on the one surface thereof. The bonding pad BP1 may be coupled to one of the page buffer circuit PBC and the row decoder X-DEC through the contacts CNT1a to CNT1d and the wiring lines M1a to M1c.

The second logic structure PS2 may include the peripheral circuit PERI. The peripheral circuit PERI may include a plurality of second horizontal transistors TR2. The second horizontal transistor TR2 may include a gate dielectric layer Gox2, which is disposed on the second surface 12 of the substrate 10, a gate electrode G2, which is disposed on the gate dielectric layer Gox2, and junctions Jn21 and Jn22, which are defined in an active region of the substrate 10 on both sides of the gate electrode G2. The junctions Jn21 and Jn22 are regions that are defined by implanting an n-type or p-type impurity into the active region of the second surface 12 of the substrate 10. One of the junctions Jn21 and Jn22 may be used as a source region of the second horizontal transistor TR2, and the other junction may be used as a drain region of the second horizontal transistor TR2.

A dielectric layer ILD2 may be defined on the second surface 12 of the substrate 10 to cover the peripheral circuit PERI. The top surface of the dielectric layer ILD2 may configure the other surface of the peripheral wafer PW. Contacts CNT2a and CNT2b and wiring lines M2a and M2b may be defined in the dielectric layer ILD2. The contacts CNT2a and CNT2b and the wiring lines M2a and M2b may be coupled to the peripheral circuit PERI.

The substrate 10 may include an isolation dielectric layer 13 that passes through the first surface 11 and the second surface 12. A through via TSV1 passes through the isolation dielectric layer 13 and couples the wiring line M2b defined in the dielectric layer ILD2 and the wiring line M1a' defined in the dielectric layer ILD1. The through via TSV1 may be defined under the wiring line M2b. The peripheral circuit PERI may be coupled to the through via TSV1 through the contacts CNT2a and CNT2b and the wiring lines M2a and M2b, and may be coupled to the row decoder X-DEC or/and the page buffer circuit PBC through the through via TSV1 and the wiring line M1a'.

The peripheral wafer PW may include an external coupling pad PAD, which is exposed by the dielectric layer ILD2. The external coupling pad PAD, as an external contact of the memory device for coupling to an external device such as a memory controller, may be exposed on the other surface of the peripheral wafer PW.

The cell wafer CW may include the substrate 20, and the memory cell array MCA, which is defined on the substrate 20. The substrate 20 may include a semiconductor material, for example, a group IV semiconductor, a group III-V compound semiconductor or a group II-VI compound semiconductor. For example, the group IV semiconductor may include silicon, germanium or silicon-germanium. For example, the substrate 20 may be provided as a polycrystalline layer or an epitaxial layer.

The memory cell array MCA may include a plurality of electrode layers 22 and a plurality of interlayer dielectric layers 24, which are alternately stacked on the substrate 20, and a plurality of vertical channels CH, which pass through the plurality of electrode layers 22 and the plurality of interlayer dielectric layers 24, alternately stacked, in the first direction FD.

The electrode layers 22 may include a conductive material. For example, the electrode layers 22 may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 22, at least one electrode layer 22 from the lowermost electrode layer 22 may configure a source select line. Among the electrode layers 22, at least one electrode layer 22 from the uppermost electrode layer 22 may configure a drain select line. The electrode layers 22 between the source select line and the drain select line may configure word lines. The interlayer dielectric layers 24 may include silicon oxide.

Although not illustrated, a plurality of first slits, which divide the electrode layers 22 and the interlayer dielectric layers 24, alternately stacked, into memory block units may be defined. A second slit, which divides at least one of the drain select line and the source select line into units each smaller than the memory block, for example, sub-block units, may be defined between adjacent first slits. Accordingly, the word lines may be divided into memory block units, and at least one of the drain select line and the source select line may be divided into sub-block units.

The electrode layers 22 may extend, for example in the second direction SD, from the cell region CR to the slimming region SR in different lengths, thereby forming stairway-shaped steps in the slimming region SR. In the slimming region SR, the electrode layers 22 may be disposed to form the steps in the second direction SD as illustrated in FIG. 5. Although not illustrated, in the slimming region SR, the electrode layers 22 may be disposed to form steps even in the third direction TD. The steps expose an underlying electrode layer 22 that extends longer than an overlying electrode layer 22, and a contact pad region that is exposed upward in the first direction FD may be defined in each of the electrode layers 22.

The plurality of vertical channels CH may pass through the plurality of electrode layers 22 and the plurality of interlayer dielectric layers 24, which are alternately stacked in the cell region CR, in the first direction FD. While not illustrated in detail, each of the vertical channels CH may include a channel layer and a gate dielectric layer. The channel layer may include polysilicon or single crystal silicon, and may include, in some regions thereof, a p-type impurity such as boron (B). The gate dielectric layer may have a shape that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

Source select transistors may be configured in areas or regions where the source select line surrounds the vertical channels CH. Memory cells may be configured in areas or regions where the word lines surround the vertical channels CH. Drain select transistors may be configured in areas or regions where the drain select line surrounds the vertical channels CH. The source select transistor, the plurality of memory cells and the drain select transistor that are disposed along one vertical channel CH may configure one cell string.

A plurality of bit lines BL may be disposed over the plurality of electrode layers 22 and the plurality of interlayer dielectric layers 24, alternately stacked, and the plurality of vertical channels CH. The bit lines BL may extend in the third direction TD and be arranged in the second direction SD. A bit line BL may be coupled to a vertical channel CH through a bit line contact BLC.

A dielectric layer ILD3 may be defined on the substrate 20 to cover the plurality of electrode layers 22 and the plurality of interlayer dielectric layers 24, the vertical channels CH, and the bit lines BL. The top surface of the dielectric layer ILD3 may configure one surface of the cell wafer CW, which is bonded to the peripheral wafer PW. The cell wafer CW may include a plurality of bonding pads BP2 which are bonded to the plurality of bonding pads BP1, on the one surface thereof.

Each of the electrode layers 22 may be coupled to one of the bonding pads BP2 through contacts CNT3a and CNT3b and a wiring line M3a, which are defined in the dielectric layer ILD3. Each of the bit lines BL may be coupled to one of the bonding pads BP2 through a contact CNT3b', which is defined in the dielectric layer ILD3.

Although only bonding pads BP2, which are coupled to some of the electrode layers 22, are illustrated in FIG. 5 for the sake of simplicity in illustration, it should be understood that a plurality of bonding pads BP2 that are coupled to the plurality of electrode layers 22, respectively, are disposed on the one surface of the cell wafer CW. Although only bonding pads BP2 that are coupled to some of the bit lines BL are illustrated in FIG. 5 for the sake of simplicity in illustration, it should be understood that a plurality of bonding pads BP2 that are coupled to the plurality of bit lines BL, respectively, are disposed on the one surface of the cell wafer CW.

The cell wafer CW and the peripheral wafer PW may be individually fabricated, and then, may be bonded to each other. The wiring lines M1a to M1c, M1a', M2a and M2b of the peripheral wafer PW may be formed of a conductive material that has a low resistivity, but may cause a process failure at a maximum temperature (hereinafter, referred to as a 'process critical temperature') during a process of forming the cell wafer CW. For example, the wiring lines M1a to M1c, M1a', M2a and M2b of the peripheral wafer PW may be formed of copper or aluminum.

In embodiments described herein, the peripheral wafer PW is formed separately from the cell wafer CW, and therefore a material that has a low melting point and a low resistivity may be used as a conductive material that forms the wiring lines M1a to M1c, M1a', M2a and M2b of the peripheral wafer PW.

Figure 6:
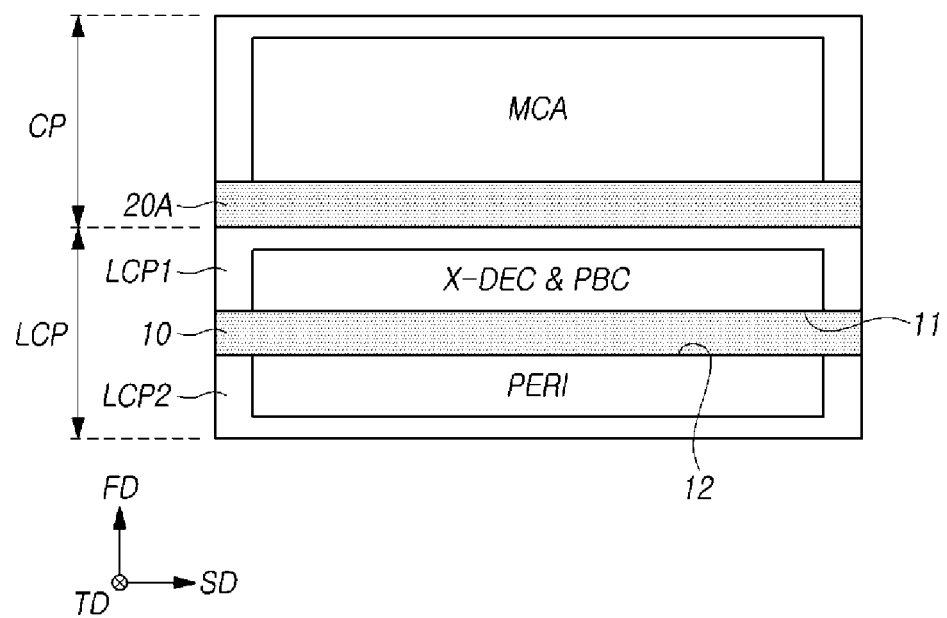
FIG. 6 is a cross-sectional view illustrating a representation of a schematic structure of a memory device in accordance with an embodiment of the disclosure.

FIG. 6 is a cross-sectional view illustrating a representation of a schematic structure of a memory device in accordance with an embodiment of the disclosure.

Referring to FIG. 6, a memory device in accordance with the present embodiment may include a logic circuit part LCP, and a cell part CP, which is stacked on the logic circuit part LCP in the first direction FD.

The logic circuit part LCP may include a substrate 10, a first logic circuit part LCP1, and a second logic circuit part LCP2.

The substrate 10 may have a first surface 11 and a second surface 12, which face away from each other in the first direction FD. The first logic circuit part LCP1 may be disposed on the first surface 11 of the substrate 10, and the second logic circuit part LCP2 may be disposed on the second surface 12 of the substrate 10.

The first logic circuit part LCP1 may include a row decoder X-DEC and a page buffer circuit PBC. The second logic circuit part LCP2 may include a peripheral circuit PERI. The cell part CP may include a source plate 20A and a memory cell array MCA, which is defined on the source plate 20A.

After the first logic circuit part LCP1, the source plate 20A and the memory cell array MCA are sequentially formed on the first surface 11 of the substrate 10, the second logic circuit part LCP2 may be formed on the second surface 12 of the substrate 10. The memory device in accordance with the present embodiment may have a monolithic structure that is integrated in a single wafer.

Figure 7:
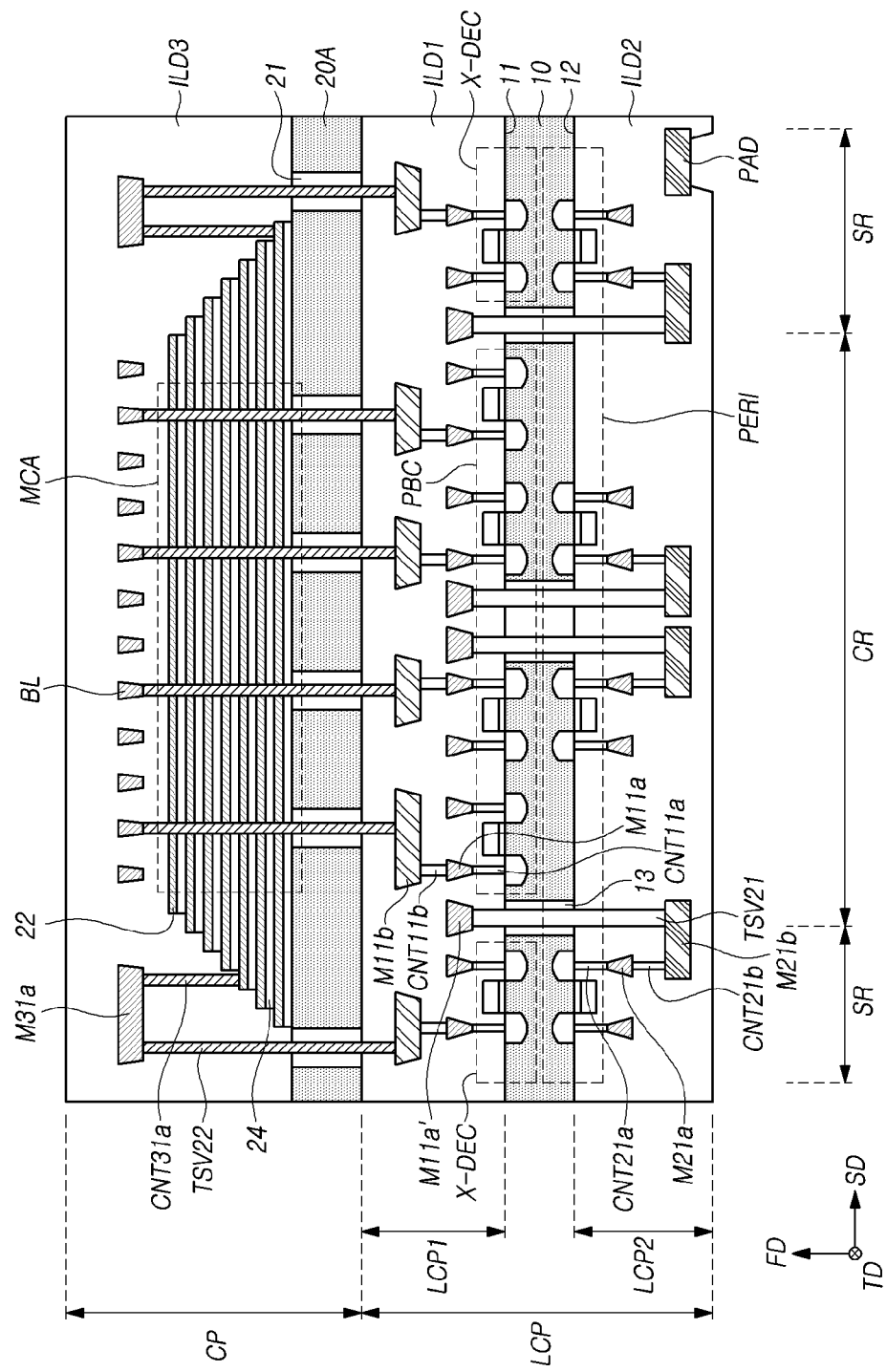
FIG. 7 is a detailed view of FIG. 6.

FIG. 7 is a detailed view of FIG. 6.

Referring to FIG. 7, the substrate 10 of the logic circuit part LCP may be a single crystal semiconductor film. For example, the substrate 10 may be a bulk silicon substrate, a germanium substrate, a silicon-germanium substrate, or an epitaxial thin film formed through selective epitaxial growth.

The first logic circuit part LCP1 may include the row decoder X-DEC and the page buffer circuit PBC, which are defined on the first surface 11 of the substrate 10. The row decoder X-DEC may be disposed in a slimming region SR of the first surface 11 of the substrate 10, and the page buffer circuit PBC may be disposed in a cell region CR of the first surface 11 of the substrate 10.

A dielectric layer ILD1 may be defined on the first surface 11 of the substrate 10 to cover the row decoder X-DEC and the page buffer circuit PBC. Contacts CNT11a and CNT11b and wiring lines M11a, M11b and M11a' may be defined in the dielectric layer ILD1. The contacts CNT11a and CNT11b and the wiring lines M11a, M11b and M11a' may be coupled to the row decoder X-DEC or/and the page buffer circuit PBC. Although not shown in detail in FIG. 7, each of the wiring lines M11a' may be coupled to the corresponding wiring line M11a, and may be coupled to the row decoder X-DEC or the page buffer circuit PBC through the corresponding wiring line M11a and the contact CNT11a.

The second logic circuit part LCP2 may include the peripheral circuit PERI, which is defined on the second surface 12 of the substrate 10. A dielectric layer ILD2 may be defined on the second surface 12 of the substrate 10 to cover the peripheral circuit PERI. Contacts CNT21a and CNT21b and wiring lines M21a and M21b may be defined in the dielectric layer ILD2. The contacts CNT21a and CNT21b and the wiring lines M21a and M21b may be coupled to the peripheral circuit PERI.

The bottom surface of the dielectric layer ILD2 may configure the other surface of the logic circuit part LCP, which faces away from one surface of the logic circuit part LCP in contact with the cell part CP. The dielectric layer ILD2 may have an opening that exposes an external coupling pad PAD. The external coupling pad PAD may be exposed on the other surface of the logic circuit part LCP.

The substrate 10 may include an isolation dielectric layer 13, which passes through the first surface 11 and the second surface 12. A through via TSV21, which couples the wiring line M11a' in the dielectric layer ILD1 and the wiring line M21b in the dielectric layer ILD2, may be defined through the isolation dielectric layer 13. The peripheral circuit PERI may be coupled to the through via TSV21 through the contacts CNT21a and CNT21b and the wiring lines M21a and M21b, and may be coupled to the row decoder X-DEC or/and the page buffer circuit PBC through the through via TSV21 and the wiring line M11a'.

The source plate 20A may be formed on the dielectric layer ILD1 of the first logic circuit part LCP1. The source plate 20A may include a semiconductor material, for example, a group IV semiconductor, a group III-V compound semiconductor or a group II-VI compound semiconductor. For example, the group IV semiconductor may include silicon, germanium or silicon-germanium. Because the source plate 20A may be formed on the dielectric layer ILD1, the source plate 20A may be formed as a polycrystalline layer or an epitaxial layer.

The memory cell array MCA may be configured by a plurality of electrode layers 22 and a plurality of interlayer dielectric layers 24, which are alternately stacked on the source plate 20A, and vertical channels (not illustrated), which pass through the plurality of electrode layers 22 and the plurality of interlayer dielectric layers 24. Bit lines BL, which are coupled to the vertical channels, may be defined over the memory cell array MCA. A plurality of through vias TSV22, which pass through the source plate 20A may be defined. An isolation dielectric layer 21 may be defined on the sidewalls of the through vias TSV22 to isolate the through vias TSV22 from the source plate 20A. The bit line BL may be coupled to the page buffer circuit PBC of the first logic circuit part LCP1 through one of the through vias TSV22, the contacts CNT11a and CNT11b and the wiring lines M11a and M11b. The electrode layer 22 may be coupled to the row decoder X-DEC of the first logic circuit part LCP1 through another one of the through vias TSV22, a contact CNT31a, a wiring line M31a and the contacts CNT11a and CNT11b and the wiring lines M11a and M11b.

A dielectric layer ILD3 may be defined on the source plate 20A to cover the memory cell array MCA.

As described above, the first logic circuit part LCP1 may be formed before the cell part CP is formed, and the second logic circuit part LCP2 may be formed after the cell part CP is formed.

The wiring lines M11a, M11b and M11a' of the first logic circuit part LCP1 may be configured to have properties that may not exhibit a process failure, for example, a hillock, at a process critical temperature as a maximum temperature during a process of forming the cell part CP. In other words, the wiring lines M11a, M11b and M11a' of the first logic circuit part LCP1 may be formed of a conductive material that has a melting point higher than the process critical temperature so as to have a heat-resistant characteristic at the process critical temperature. For example, a material used to form the wiring lines M11a, M11b and M11a' of the first logic circuit part LCP1 may include tungsten (W). Meanwhile, a conductive material that forms the wiring lines M21a and M21b of the second logic circuit part LCP2 may include a material that has a lower resistivity than the conductive material which forms the wiring lines M11a, M11b and M11a' of the first logic circuit part LCP1. For example, the conductive material used to form the wiring lines M21a and M21b of the second logic circuit part LCP2 may include a material, such as copper or aluminum, which may cause a process failure at a temperature lower than the process critical temperature, but has a low resistivity.

Since the wiring lines M21a and M21b of the second logic circuit part LCP2 are formed after the cell part CP is formed, a material that has a low melting point and a low resistivity may be used as a conductive material used to form the wiring lines M21a and M21b of the second logic circuit part LCP2.

Figure 8:
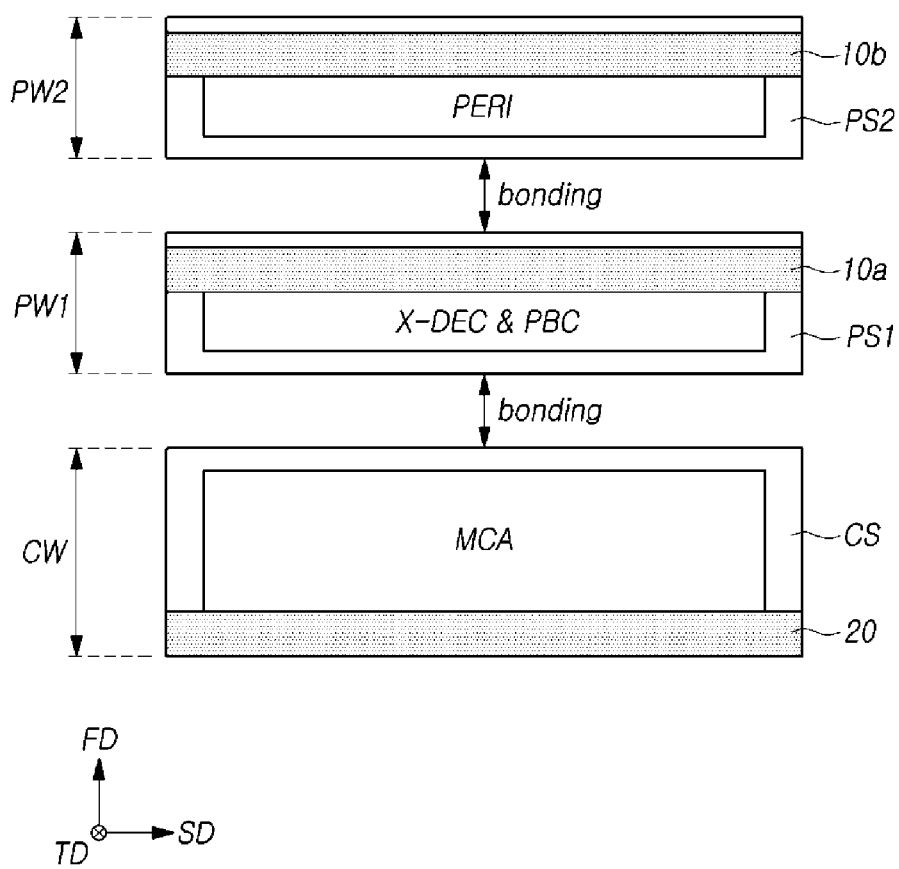
FIG. 8 is a cross-sectional view illustrating a representation of a schematic structure of a memory device in accordance with an embodiment of the disclosure.

FIG. 8 is a cross-sectional view illustrating a representation of a schematic structure of a memory device in accordance with an embodiment of the disclosure.

Referring to FIG. 8, a memory device in accordance with an embodiment of the disclosure may include a cell wafer CW, a first peripheral wafer PW1 that is bonded onto the cell wafer CW, and a second peripheral wafer PW2 that is bonded onto the first peripheral wafer PW1.

In order to facilitate understanding, FIG. 8 illustrates the cell wafer CW and the first peripheral wafer PW1 separated from each other, and the first peripheral wafer PW1 and the second peripheral wafer PW2 separated from each other. However, it should be understood that the top surface of the cell wafer CW and the bottom surface of the first peripheral wafer PW1 are in contact with each other and the top surface of the first peripheral wafer PW1 and the bottom surface of the second peripheral wafer PW2 are in contact with each other.

The first peripheral wafer PW1 may include a substrate 10*a* and a first logic structure PS1, which is defined on the bottom surface of the substrate 10*a*. The first logic structure PS1 may include a row decoder X-DEC and a page buffer circuit PBC.

The second peripheral wafer PW2 may include a substrate 10*b* and a second logic structure PS2, which is defined on the bottom surface of the substrate 10*b*. The second logic structure PS2 may include a peripheral circuit PERI.

The row decoder X-DEC may be coupled to a memory cell array MCA of the cell wafer CW through word lines, and the page buffer circuit PBC may be coupled to the memory cell array MCA through bit lines. Because the row decoder X-DEC and the page buffer circuit PBC directly interface with the memory cell array MCA, which is configured in the first peripheral wafer PW1 and bonded to the cell wafer CW, it is possible to shorten the lengths of electrical paths that couple the row decoder X-DEC and the page buffer circuit PBC to the memory cell array MCA.

The cell wafer CW may include a substrate 20, and a cell structure CS that is defined on the substrate 20. The cell structure CS may include the memory cell array MCA.

Figure 9:
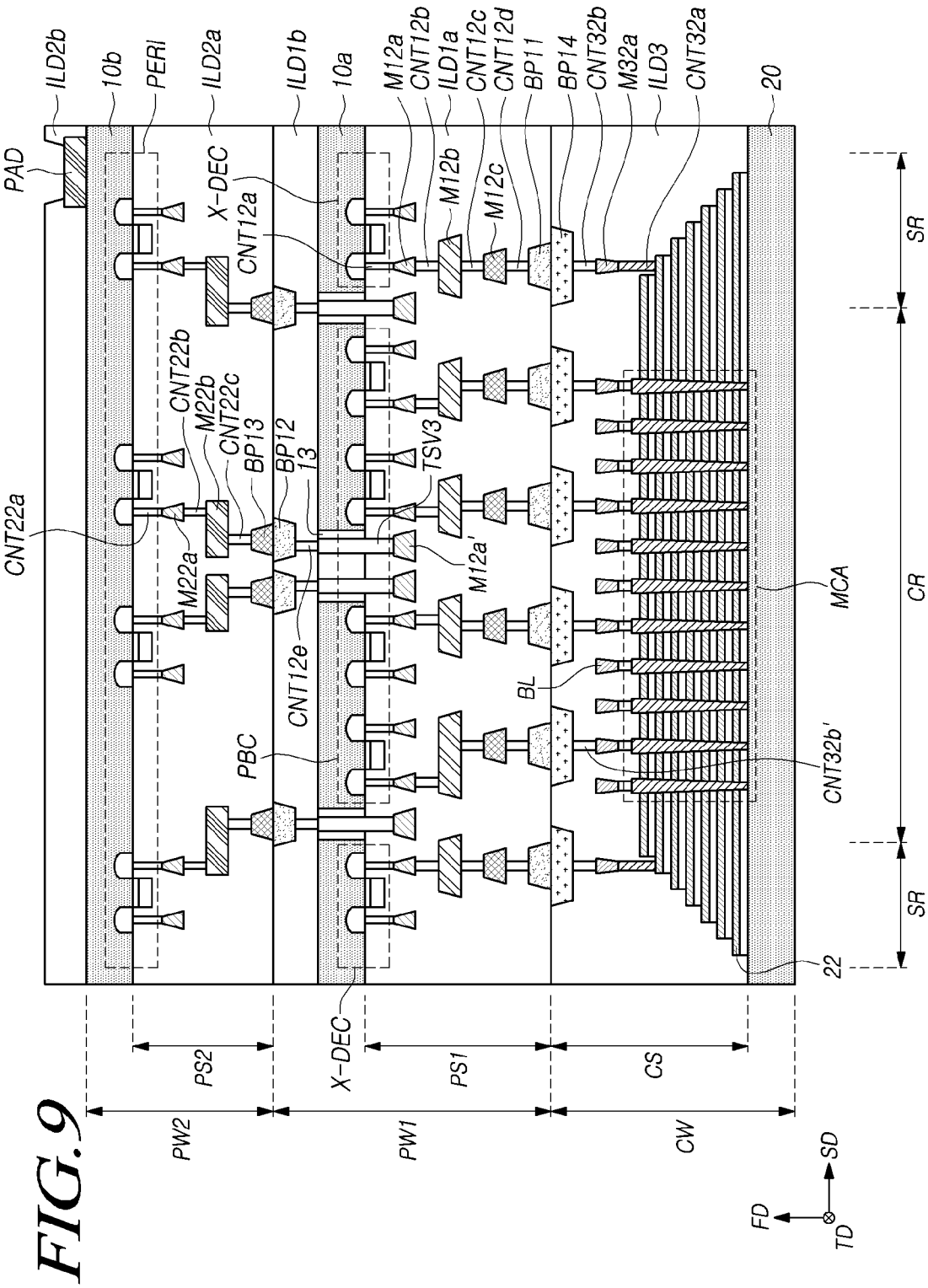
FIG. 9 is a detailed view of FIG. 8.

FIG. 9 is a detailed view of FIG. 8.

Referring to FIG. 9, the substrate 10*a* of the first logic wafer PW1 may be a single crystal semiconductor film. For example, the substrate 10*a* may be a bulk silicon substrate, a germanium substrate, a silicon-germanium substrate, or an epitaxial thin film formed through selective epitaxial growth.

The first logic structure PS1 may include the row decoder X-DEC and the page buffer circuit PBC. The row decoder X-DEC may be disposed in a slimming region SR of the bottom surface of the substrate 10*a*, and the page buffer circuit PBC may be disposed in a cell region CR of the bottom surface of the substrate 10*a*.

A dielectric layer ILD1a may be defined on the bottom surface of the substrate 10*a* to cover the row decoder X-DEC and the page buffer circuit PBC. The bottom surface of the dielectric layer ILD1a may configure one surface of the first peripheral wafer PW1, which is bonded to the cell wafer CW. Contacts CNT12a to CNT12d and wiring lines M12a to M12c and M12a' may be defined in the dielectric layer ILD1a. The contacts CNT12a to CNT12d and the wiring lines M12a to M12c and M12a' may be coupled to the row decoder X-DEC or the page buffer circuit PBC. Although not shown in detail in FIG. 9, each of the wiring lines M12a' may be coupled to the corresponding wiring line M12a, and may be coupled to the row decoder X-DEC or the page buffer circuit is PBC through the corresponding wiring line M12a and the contact CNT12a.

The first peripheral wafer PW1 may include a plurality of bonding pads BP11 on the one surface thereof. A bonding pad BP11 may be coupled to one of the page buffer circuit PBC and the row decoder X-DEC through the contacts CNT12a to CNT12d and the wiring lines M12a to M12c.

The substrate 10*a* may include an isolation dielectric layer 13 which passes through the top surface and the bottom surface thereof. A through via TSV3, which is coupled to the wiring line M12a' in the dielectric layer ILD1a, may be defined through the isolation dielectric layer 13.

A dielectric layer ILD1b may be defined on the top surface of the substrate 10*a*. The top surface of the dielectric layer ILD1b may configure the other surface of the first peripheral wafer PW1, which is bonded to the second peripheral wafer PW2. The first peripheral wafer PW1 may include a plurality of bonding pads BP12 on the other surface thereof.

The bonding pad BP12 may be coupled to the through via TSV3 through a contact CNT12e, and may be coupled to one of the row decoder X-DEC and the page buffer circuit PBC through the through via TSV3 and the wiring line M12a'.

The second peripheral wafer PW2 may include the substrate 10*b* and the second logic structure PS2. The substrate 10*b* may be a single crystal semiconductor film. For example, the substrate 10*b* may be a bulk silicon substrate, a germanium substrate, a silicon-germanium substrate, or an epitaxial thin film formed through selective epitaxial growth.

The second logic structure PS2 may include the peripheral circuit PERI, which is defined on the bottom surface of the substrate 10*b*. A dielectric layer ILD2a may be defined on the bottom surface of the substrate 10*b* to cover the peripheral circuit PERI. The bottom surface of the dielectric layer ILD2*a* may configure one surface of the second peripheral wafer PW2, which is bonded to the first peripheral wafer PW1.

Contacts CNT22*a* to CNT22*c* and wiring lines M22*a* and M22*b* may be defined in the dielectric layer ILD2*a*. The contacts CNT22*a* to CNT22*c* and the wiring lines M22*a* and M22*b* may be coupled to the peripheral circuit PERI.

The second peripheral wafer PW2 may include, on the one surface thereof, a plurality of bonding pads BP13, which are bonded to the bonding pads BP12 of the first peripheral wafer PW1. The bonding pad BP13 may be coupled to the peripheral circuit PERI through the contacts CNT22*a* to CNT22*c* and the wiring lines M22*a* and M22*b*.

An external coupling pad PAD may be defined on the top surface of the substrate 10*b*. A dielectric layer ILD2*b* may be defined on the top surface of the substrate 10*b*, and may have an opening which exposes the external coupling pad PAD. Although not illustrated, the external coupling pad PAD may be coupled to the peripheral circuit PERI through a through via that passes through the substrate 10*b*.

The cell wafer CW may include the substrate 20, and the memory cell array MCA, which is defined on the substrate 20. A dielectric layer ILD3 may be defined on the substrate 20 to cover the memory cell array MCA. The top surface of the dielectric layer ILD3 may configure one surface of the cell wafer CW, which is bonded to the first peripheral wafer PW1.

The cell wafer CW may include a plurality of bonding pads BP14 on the one surface thereof. Each of electrode layers 22 may be coupled to one of the bonding pads BP14 through contacts CNT32*a* and CNT32*b* and a wiring line M32*a*, which are defined in the dielectric layer ILD3. Each of bit lines BL may be coupled to one of the bonding pads BP14 through a contact CNT32*b'*, which is defined in the dielectric layer ILD3.

The cell wafer CW, the first peripheral wafer PW1 and the second peripheral wafer PW2 may be individually fabricated, and then, may be bonded to one another. The wiring lines M12*a* to M12*c* of the first peripheral wafer PW1 and the wiring lines M22*a* and M22*b* of the second peripheral wafer PW2 may be formed of a conductive material that may cause a process failure at a process critical temperature of a process of forming the cell wafer CW, but has a low resistivity. For example, the wiring lines M12*a* to M12*c* of the first peripheral wafer PW1 and the wiring lines M22*a* and M22*b* of the second peripheral wafer PW2 may be formed of copper or aluminum.

Because the first peripheral wafer PW1 and the second peripheral wafer PW2 are formed separately from the cell wafer CW, a material that has a low melting point and a low resistivity may be used as a conductive material that forms the wiring lines M12*a* to M12*c* of the first peripheral wafer PW1 and the wiring lines M22*a* and M22*b* of the second peripheral wafer PW2.

As the occupation areas of the row decoder X-DEC and the page buffer circuit PBC increase due to high integration and high capacity, there may be a limitation in disposing the peripheral circuit PERI to overlap with the memory cell array MCA. As a result, the area of the memory device, that is, the area of a plane perpendicular to the first direction FD may increase, thereby limiting an increase in the degree of integration of the memory device. By disposing the peripheral circuit PERI in the surface of a different substrate separate from the row decoder X-DEC and the page buffer circuit PBC, the present embodiments may remove the limitation in disposing the peripheral circuit PERI due to presence of the row decoder X-DEC and the page buffer circuit PBC, thereby contributing to increases in the degree of integration of the memory device.

Figure 10:
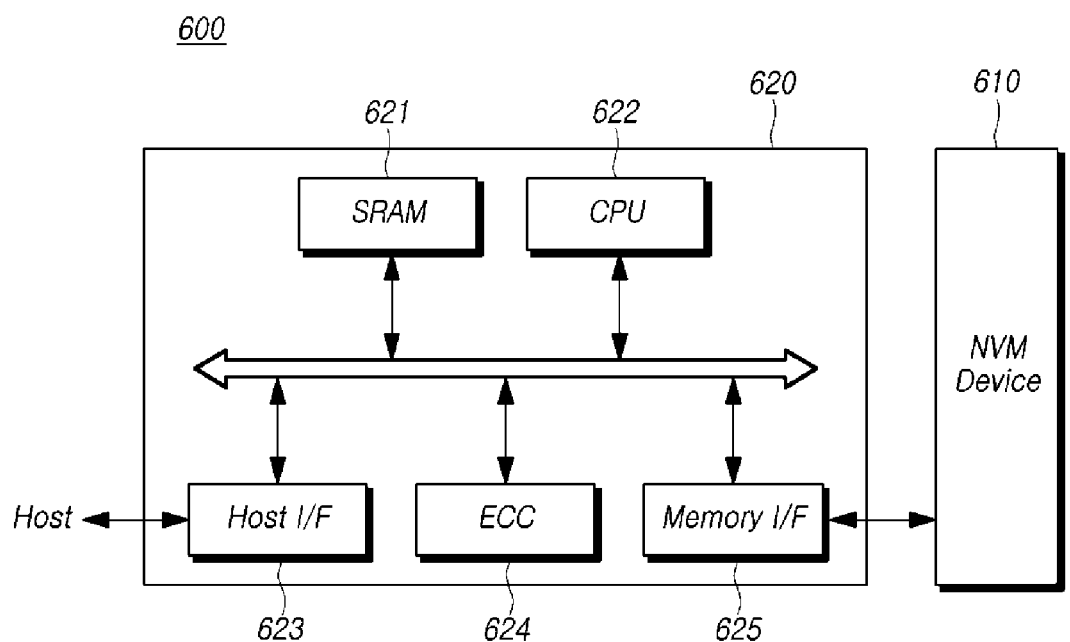
FIG. 10 is a block diagram schematically illustrating a representation of a memory system including a memory device in accordance with an embodiment of the disclosure.

FIG. 10 is a block diagram schematically illustrating a representation of a memory system including a memory device in accordance with an embodiment of the disclosure.

Referring to FIG. 10, a memory system 600 in accordance with an embodiment may include a nonvolatile memory device (NVM Device) 610 and a memory controller 620.

The nonvolatile memory device (NVM Device) 610 may be constituted by the memory device described above and may operate in the manner described above. The memory controller 620 may be configured to control the nonvolatile memory device (NVM Device) 610. By the combination of the nonvolatile memory device (NVM Device) 610 and the memory controller 620, a memory card or a solid state disk (SSD) may be provided. An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device (NVM Device) 610.

A memory interface (Memory I/F) 625 interfaces with the nonvolatile memory device (NVM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 11:
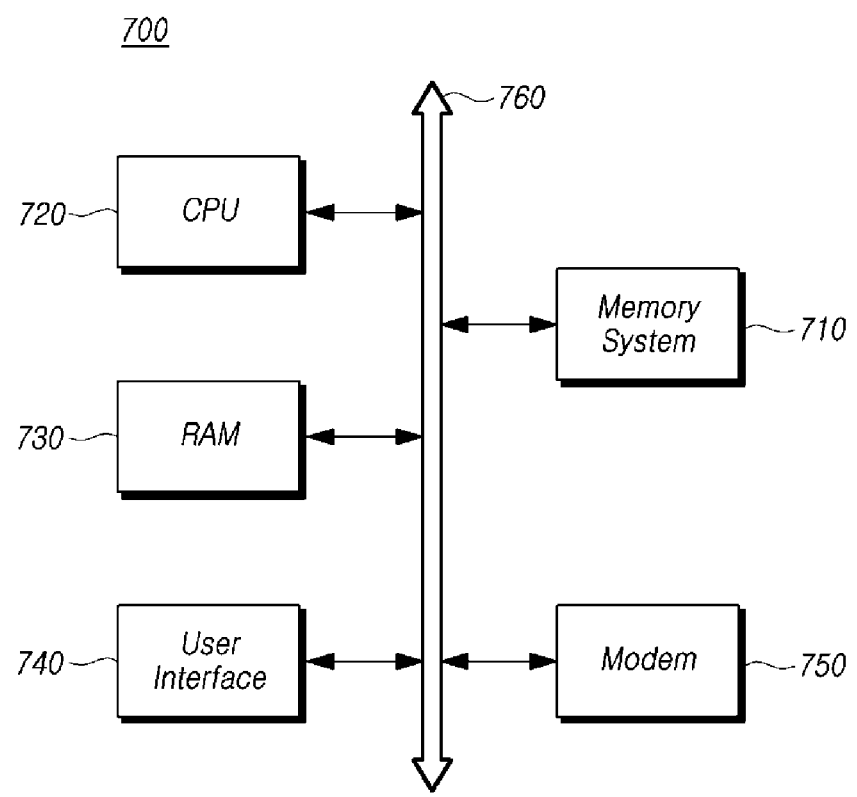
FIG. 11 is a block diagram schematically illustrating a representation of a computing system including a memory device in accordance with an embodiment of the disclosure.

FIG. 11 is a block diagram schematically illustrating a representation of a computing system including a memory device in accordance with an embodiment of the disclosure.

Referring to FIG. 11, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory device comprising:
   a cell wafer including a memory cell array;
   a first peripheral wafer, including a row control circuit and a column control circuit; and
   a second peripheral wafer, including a peripheral circuit,
   wherein the first peripheral wafer and the second peripheral wafer are stacked on the cell wafer in a first direction, and
   the row control circuit, the column control circuit and the peripheral circuit control the memory cell array,
   wherein the peripheral circuit generates a row address and a page buffer control signal in response to a command signal, an address signal and a control signal from a memory controller,
   wherein the peripheral circuit provides the row address to the row control circuit and provides the page buffer control signal to the column control circuit.

2. The memory device according to claim 1, wherein the first peripheral wafer is closer to the cell wafer in the first direction than the second peripheral wafer.

3. The memory device according to claim 2,
   wherein the first peripheral wafer further includes, on one surface thereof bonded to the second peripheral wafer, a plurality of first bonding pads that are coupled to the row control circuit or the column control circuit, and
   wherein the second peripheral wafer further includes, on the second surface, a plurality of second bonding pads that are coupled to the peripheral circuit and are bonded to the plurality of first bonding pads.

4. The memory device according to claim 2,
   wherein the first peripheral wafer further includes, on one surface thereof bonded to the cell wafer, a plurality of first bonding pads, each coupled to the row control circuit or the column control circuit, and
   wherein the cell wafer further includes, on one surface thereof bonded to the first peripheral wafer, a plurality of second bonding pads that are coupled to the memory cell array and are bonded respectively to the plurality of first bonding pads.

5. The memory device according to claim 1, wherein the memory cell array comprises:
   a plurality of word lines and a plurality of interlayer dielectric layers alternately stacked on a substrate; and
   a plurality of vertical channels passing through the plurality of word lines and the plurality of interlayer dielectric layers.

* * * * *